(12) United States Patent
Lee et al.

(10) Patent No.: US 10,354,713 B2
(45) Date of Patent: Jul. 16, 2019

(54) DRAM AND METHOD FOR DETERMINING BINARY LOGIC USING A TEST VOLTAGE LEVEL

(71) Applicant: NANYA TECHNOLOGY CORPORATION, New Taipei (TW)

(72) Inventors: Chung-Hsun Lee, New Taipei (TW); Hsien-Wen Liu, Luzhu Township, Taoyuan County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/201,206

(22) Filed: Nov. 27, 2018

(65) Prior Publication Data

US 2019/0115068 A1    Apr. 18, 2019

Related U.S. Application Data

(62) Division of application No. 15/782,271, filed on Oct. 12, 2017.

(51) Int. Cl.
| | |
|---|---|
| *G11C 11/406* | (2006.01) |
| *G11C 11/4094* | (2006.01) |
| *G11C 29/50* | (2006.01) |
| *G11C 11/4074* | (2006.01) |

(52) U.S. Cl.
CPC .... *G11C 11/40603* (2013.01); *G11C 11/4074* (2013.01); *G11C 11/4094* (2013.01); *G11C 29/50* (2013.01); *G11C 2029/5004* (2013.01)

(58) Field of Classification Search
CPC .......... G11C 11/40603; G11C 11/4094; G11C 11/4074; G11C 29/50; G11C 2029/5004
See application file for complete search history.

(56) References Cited

U.S. PATENT DOCUMENTS

| | | | |
|---|---|---|---|
| 5,652,723 | A | 7/1997 | Dosaka et al. |
| 6,438,057 | B1 | 8/2002 | Ruckerbauer |
| 9,653,142 | B1 | 5/2017 | Kihara |
| 2003/0169635 | A1 | 9/2003 | Kim |
| 2009/0262589 | A1 | 10/2009 | Kong |
| 2012/0275214 | A1 | 11/2012 | Atsumi et al. |
| 2012/0300568 | A1 | 11/2012 | Park et al. |
| 2018/0166117 | A1 | 6/2018 | Choi et al. |

FOREIGN PATENT DOCUMENTS

| | | |
|---|---|---|
| KR | 20120115131 A | 10/2012 |
| TW | 201506950 A | 2/2015 |

*Primary Examiner* — Jerome Leboeuf
(74) *Attorney, Agent, or Firm* — Muncy, Geissler, Olds & Lowe, P.C.

(57) ABSTRACT

A dynamic random access memory (DRAM) includes a memory array and a control device. The memory array includes a refresh unit. The refresh unit includes a first cell and a second cell. The first cell is configured to store data, and have a programmed voltage level by being programmed. The second cell is configured to have a test voltage level by being programmed in conjunction with the first cell, wherein the first cell and the second cell are controllable by a same row of the memory array. The control device is configured to increase a voltage difference between the programmed voltage level and a standard voltage level for determining binary logic when the test voltage level becomes lower than a threshold voltage level, wherein the threshold voltage level is higher than the standard voltage level.

5 Claims, 7 Drawing Sheets

DRAM AND METHOD FOR DETERMINING BINARY LOGIC USING A TEST VOLTAGE LEVEL

PRIORITY CLAIM AND CROSS-REFERENCE

This application is a divisional application of U.S. patent application Ser. No. 15/782,271, filed on Oct. 12, 2017. The entirety of the above-mentioned patent application is hereby incorporated by reference herein and made a part of this specification.

TECHNICAL FIELD

The present disclosure relates to a dynamic random access memory (DRAM) and a method for operating the same, and more particularly, to programming and sensing a DRAM.

DISCUSSION OF THE BACKGROUND

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charge is stored in the capacitor, the cell is said to store a logic HIGH, depending on the convention used. If no charge is present, the cell is said to store a logic LOW. Because the charge in the capacitor dissipates over time, DRAM systems require additional refreshing circuitries to periodically refresh the charge stored in the capacitors. Since a capacitor can store only a very limited amount of charge, in order to quickly distinguish the difference between a logic 1 and a logic 0, two bit lines (BLs) are typically used for each bit, wherein the first in the bit line pair is known as a bit line true (BLT) and the other is the bit line complement (BLC). The single NMOS transistor's gate is controlled by a word line (WL).

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a DRAM including a memory array and a control device. The memory array includes a refresh unit. The refresh unit includes a first cell and a second cell. The first cell is configured to store data, and have a programmed voltage level by being programmed. The second cell is configured to have a test voltage level by being programmed in conjunction with the first cell, wherein the first cell and the second cell are controllable by a same row of the memory array. The control device is configured to increase a voltage difference between the programmed voltage level and a standard voltage level for determining binary logic when the test voltage level becomes lower than a threshold voltage level, wherein the threshold voltage level is higher than the standard voltage level.

In some embodiments, the control device is configured to decrease a refresh rate of the refresh unit after the voltage difference is increased.

In some embodiments, a level of a decrease of the test voltage level has positive correlation with a level of a decrease of the standard voltage level.

In some embodiments, a level of a decrease of the test voltage level has positive correlation with a level of an increase of a program voltage for programming the first cell and the second cell.

In some embodiments, the DRAM further includes an observation device configured to monitor a decrease, due to a degradation of the second cell, in the test voltage level.

In some embodiments, the control device is configured to decrease the standard voltage level when the test voltage level becomes lower than the threshold voltage level.

In some embodiments, the threshold voltage level is a first threshold voltage level. The control device is configured to decrease the standard voltage level to a first decreased voltage level when the test voltage level becomes lower than the first threshold voltage level and remains higher than a second threshold voltage level, wherein the second threshold voltage level is higher than the standard voltage level.

In some embodiments, the control device is configured to decrease the standard voltage level to a second decreased voltage level lower than the first decreased voltage level when the test voltage level becomes lower than both the first threshold voltage level and the second threshold voltage level.

In some embodiments, the test voltage level is a second test voltage level, and the refresh unit further includes a third cell configured to have a third test voltage level by being programmed in conjunction with the first cell. The control device is configured to decrease the standard voltage level to a first decreased voltage level when the second test voltage level becomes lower than the threshold voltage level and the third test voltage level remains higher than the threshold voltage level.

In some embodiments, the control device is configured to decrease the standard voltage level to a second decreased voltage level lower than the first decreased voltage level when both the second test voltage level and the third test voltage level become lower than the threshold voltage level.

In some embodiments, the control device is configured to increase the programmed voltage level by increasing a program voltage for programming the first cell and the second cell when the test voltage level becomes lower than the threshold voltage level.

In some embodiments, the threshold voltage level is a first threshold voltage level. The control device is configured to increase the program voltage to a first program voltage when the test voltage level becomes lower than the first threshold voltage level and remains higher than a second threshold voltage level, wherein the second threshold voltage level is higher than the standard voltage level.

In some embodiments, the control device is configured to increase the program voltage to a second program voltage higher than the first program voltage when the test voltage level becomes lower than both the first threshold voltage level and the second threshold voltage level.

In some embodiments, the test voltage level is a second test voltage level, and the refresh unit further includes a third cell configured to have a third test voltage level by being programmed in conjunction with the first cell. The control device is configured to increase the program voltage to a first program voltage when the second test voltage level becomes lower than the threshold voltage level and the third test voltage level remains higher than the threshold voltage level.

In some embodiments, the control device is configured to increase the program voltage to a second program voltage higher than the first program voltage when both the second test voltage level and the third test voltage level become lower than the threshold voltage level.

Another aspect of the present disclosure provides a method. The method includes programming a first cell and a second cell controllable by a row of a refresh unit, wherein the first cell has a programmed voltage level and the second cell has a test voltage level by being programmed; sensing the test voltage level of the second cell; and increasing a voltage difference between the programmed voltage level and a standard voltage level for determining binary logic when the test voltage level becomes lower than a threshold voltage level, wherein the threshold voltage level is higher than the standard voltage level.

In some embodiments, the increasing of the voltage difference between the programmed voltage level and the standard voltage level for determining binary logic when the test voltage level becomes lower than the threshold voltage level includes: decreasing the standard voltage level when the test voltage level becomes lower than the threshold voltage level.

In some embodiments, the increasing of the voltage difference between the programmed voltage level and the standard voltage level for determining binary logic when the test voltage level becomes lower than the threshold voltage level includes: increasing the programmed voltage level by increasing a program voltage for programming the first cell and the second cell when the test voltage level becomes lower than the threshold voltage level.

In the present disclosure, a refresh unit that includes the degraded first cell for storing a user data can be identified. As such, the voltage difference associated with the first cell can be increased to prevent the user data from being lost. Moreover, since such refresh unit can be identified, a refresh rate of such refresh unit can be decreased after the voltage difference between the programmed voltage level and the standard voltage level is increased. As a result, power consumption of a DRAM operating in the manner of the present disclosure is relatively efficient.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
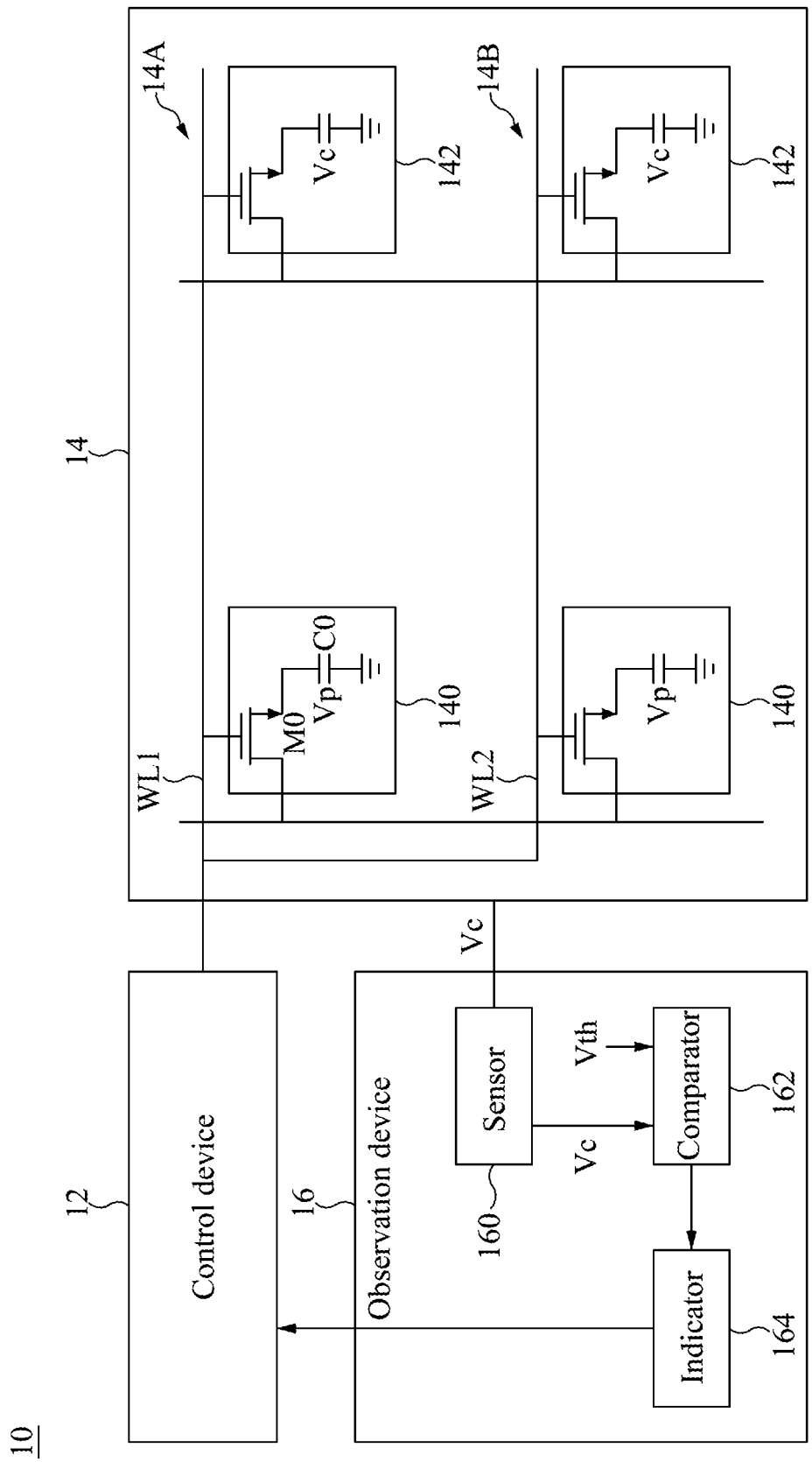
FIG. 1 is a block diagram of a dynamic random access memory (DRAM), in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of a dynamic random access memory (DRAM) 10, in accordance with some embodiments of the present disclosure. Referring to FIG. 1, the DRAM 10 includes a control device 12, a memory array 14, and an observation device 16.

The control device 12 functions to control an access operation, for example, a read operation, a write operation, a burst read operation, or a burst write operation, on the memory array 14. Moreover, the control device 12 functions to increase a voltage difference between a programmed voltage level Vp and a standard voltage level for determining binary logic, thereby ensuring data correctness without an increase in power consumption, which will be described in detail below. The binary logic includes binary 1 and binary 0. When a voltage level of a data is higher than the standard voltage level, the data is determined and interpreted as the binary 1 or the binary 0 by, for example, a processor, depending on a designer's preferences. For clarity of discussion, in the following text, when a voltage level of a data is higher than the standard voltage level, the data is determined and interpreted as the binary 1. Similarly, when a voltage level of a data is lower than the standard voltage level, the data is determined and interpreted as the binary 0.

In an embodiment, the control device 12 decreases a refresh rate of a refresh unit after the voltage difference is increased, which will be discussed in detail below. As a result, power consumption of the DRAM 10 is relatively efficient. In an embodiment, the control device 12 includes a central processing unit (CPU) or part of a computing module.

The memory array 14 includes a first refresh unit 14A and a second refresh unit 14B. The first refresh unit 14A functions to store data. The second refresh unit 14B also functions to store data.

The first refresh unit 14A includes a row WL1, a first cell 140 and a second cell 142. The first cell 140 and the second cell 142 are controllable by the same row WL1, which means that the first cell 140 and the second cell 142 are programmed in the same manner.

The first cell 140 functions to store data. In further detail, the first cell 140 includes a transistor M0 and a capacitor C0. Data is stored in the first cell 140 by, for example, applying a program voltage (i.e., a voltage on the word line WL1) for programming the first cell 140 on the transistor M0 to charge the capacitor C0. As a result, the first cell 140 is provided with a programmed voltage level Vp by being programmed. In an embodiment, the programmed voltage level Vp is deemed as a voltage level of the capacitor C0. The voltage level of the capacitor C0 represents the data stored. After the DRAM 10 has been used for a long time, the first cell 140 gradually becomes degraded and therefore, for example, the capacitor C0 of the first cell 140 gradually becomes degraded. Consequently, if the degraded first cell 140 is programmed in a given period with a program voltage with which the not degraded first cell 140 in the initial state is programmed, the degraded capacitor C0 is unable to be charged to a voltage level to which the not degraded capacitor C0 in the initial state is charged. As such, the voltage level of the degraded capacitor C0 is relatively low, resulting in a decrease of a voltage difference, called a voltage difference associated with the first cell 140 hereinafter, between the voltage level of the degraded capacitor C0 of the first cell 140 and the standard voltage level. As a result, a possibility of a data being incorrect is increased. For example, a user stores a data into the first cell 140 by charging the capacitor C0 to a voltage level higher than the standard voltage level. Such data is interpreted and determined as the binary 1. However, when the first cell 140 is degraded, the voltage level may be decreased to be lower than the standard voltage level. As such, the data will be interpreted and determined as the binary 0. As a result, the data is incorrect. Such defect is alleviated or eliminated by using the second cell 142 and the observation device 16 as discussed below. In addition, data stored in the first cell 140 is a data associated with, for example, a program that a user executes. As such, the data stored in the first cell 140 can also be called a user data, and the first cell 140 can be called a user cell.

The second cell 142 serves as a medium for detecting a degradation of the first cell 140. In further detail, the second cell 142 has the same semiconductor structure as the first cell 140. In addition, as previously mentioned, the second cell 142 is programmed in the same manner as the first cell 140 because it is controllable by the same row WL1 as the first cell 140. Consequently, the second cell 142 has substantially the same level of degradation as the first cell 140. As a result, a level of degradation of the first cell 140 can be identified by detecting a level of degradation of the second cell 142. In the present disclosure, to detect a level of degradation of the second cell 142, the second cell 142 is configured to have the test voltage level Vc by being programmed in conjunction with the first cell 140. The level of the degradation of the second cell 142 can be determined by analyzing a decrease of the test voltage level Vc as discussed below. In addition, the second cell 142 is used to store a dummy data instead of a data associated with a program that a user executes. Therefore, the second cell 142 can be called a redundant cell, or a reference cell.

For clarity of discussion, only one first cell 140 serving as a data cell is depicted. However, the present disclosure is not limited thereto. In some embodiments, the first refresh unit 14A may include a plurality of first cells 140.

The second refresh unit 14B is similar in operation and in components to the first refresh unit 14A except that, for example, the second refresh unit 14B includes a word line WL2. Therefore, description of operation of the second refresh unit 14B is omitted herein.

The observation device 16 functions to determine whether the second cell 142 is degraded based on a decrease in the test voltage level Vc, and to inform the control device 12 of the observation result. The control device 12, based on the observation result, increases the voltage difference between the programmed voltage level Vp and the standard voltage level. As a result, data correctness is ensured.

When a DRAM includes a plurality of refresh units, as in the DRAM 10, the observation device 16 is able to identify which refresh unit includes the degraded first cell 140. The observation device 16 provides the control device 12 with the identification result. Accordingly, the control device 12 increases the voltage difference associated with the first cell 140 of the refresh unit identified.

With the observation device 16 and the second cell 142, a refresh unit that includes the degraded first cell 140 for storing a user data can be identified. As such, the voltage difference associated with the first cell 140 can be increased to prevent the user data from being lost. Moreover, since such refresh unit can be identified, a refresh rate of such refresh unit can be decreased after the voltage difference between the programmed voltage level Vp and the standard voltage level is increased. As a result, power consumption of the DRAM 10 is relatively efficient.

The present disclosure includes two embodiments to implement the increase of the voltage difference as discussed below.

In the first embodiment, the standard voltage level for determining binary logic is decreased, thereby increasing the voltage difference associated with the first cell 140. For better understanding of the first embodiment, it is assumed that in an initial state, the programmed voltage level Vp is set to be about 0.5 volts (V), and the standard voltage level for determining binary logic is about 0.3 V. That is, the voltage difference therebetween is 0.2V. After the DRAM 10 has been used for a long time, the programmed voltage level Vp decreases to about 0.4V. The voltage difference accordingly is decreased to 0.1V. As the voltage difference associated with the first cell 140 becomes smaller, a possibility of misjudgment on binary logic of the first cell 140 is increased. In the first embodiment, the control device 12 decreases the standard voltage level when the second cell 142 is determined to be degraded, thereby keeping the voltage difference associated with the first cell 140 unchanged, or even increasing the voltage difference associated with the first cell 140. As a result, a possibility of misjudgment on binary logic of the first cell 140 is not increased even though the first cell 140 is degraded. Further, there is no need to maintain at a relatively high level a refresh rate of a refresh unit including the second cell 142 determined to be degraded. As a result, power consumption of the DRAM 10 is relatively efficient.

In the second embodiment, the program voltage for programming the first cell 140 and the second cell 142 is increased, thereby increasing the programmed voltage level Vp. As a result, the voltage difference associated with the first cell 140 is increased. For better understanding of the second embodiment, it is assumed that in an initial state, the programmed voltage level Vp is set to be about 0.5V, and the standard voltage level for determining binary logic is about 0.3V. That is, the voltage difference therebetween is 0.2V. After the DRAM 10 has been used for a long time, the first cell 140 becomes degraded. The degraded first cell 140 is unable to be charged to 0.5V in a given period as previously discussed. Once the first cell 140 is only able to be charged to 0.4V in a given period, the voltage difference accordingly is decreased to 0.1V. As the voltage difference associated with the first cell 140 becomes smaller, a possibility of misjudgment on binary logic of the first cell 140 is increased. In the second embodiment, to raise the programmed voltage level Vp of the first cell 140 to 0.5V in a given period, a possible approach is to increase the program voltage level, i.e., a voltage level of the word line WL1. By increasing the program voltage level, the transistor M0 can conduct better. As such, the first cell 140 can be charged to 0.5V or higher in a given period, thereby keeping the voltage difference associated with the first cell 140 unchanged, or even increasing the voltage difference associated with the first cell 140. As a result, a possibility of misjudgment on binary logic of the first cell 140 is not increased even though the first cell 140 is degraded. Further, there is no need to maintain at a relatively high level a refresh rate of a refresh unit including the second cell 142 determined to be degraded. As a result, power consumption of the DRAM 10 is relatively efficient.

The observation device 16 includes a sensor 160, a comparator 162 and an indicator 164.

The sensor 160 functions to sense the test voltage level Vc, and sends a sensing result indicating the test voltage level Vc to the comparator 162.

The comparator 162 functions to compare the test voltage level Vc with a threshold voltage level Vth. The threshold voltage level Vth is higher than the standard voltage level for determining binary logic.

The reason why the threshold voltage level Vth is set to be higher than the standard voltage level is that the control device 12 can increase the voltage difference associated with the first cell 140 so as to maintain a correctness of a data stored by the first cell 140 before the programmed voltage level Vp becomes lower than the standard voltage level. If the programmed voltage level Vp becomes lower than the standard voltage level, the data may be caused to be incorrect.

The indicator 164 determines, based on the comparison result from the comparator 162, whether the second cell 142 is degraded. The control device 12, based on the determination from the indicator 164, increases the voltage difference between the programmed voltage level Vp and the standard voltage level, as previously mentioned. Moreover, when a DRAM includes a plurality of refresh units as with the DRAM 10, the indicator 164 is able to identify which refresh unit includes the degraded first cell 140. Accordingly, the control device 12 increases the voltage difference associated with the first cell 140 of the refresh unit identified.

In operation, after the DRAM 10 has been used for a long time, the second cell 142 gradually becomes degraded and therefore the test voltage level Vc of the second cell 142 is gradually decreased. If the test voltage level Vc remains higher than the threshold voltage level Vth, the observation device 16 determines that the second cell 142 is not degraded. As a result, the control device 12 maintains the substantially same voltage difference associated with the first cell 140. Alternatively, if the test voltage level Vc becomes lower than the threshold voltage level Vth, the observation device 16 determines that the second cell 142 is degraded. As a result, the control device 12 increases the voltage difference associated with the first cell 140.

Figure 2:
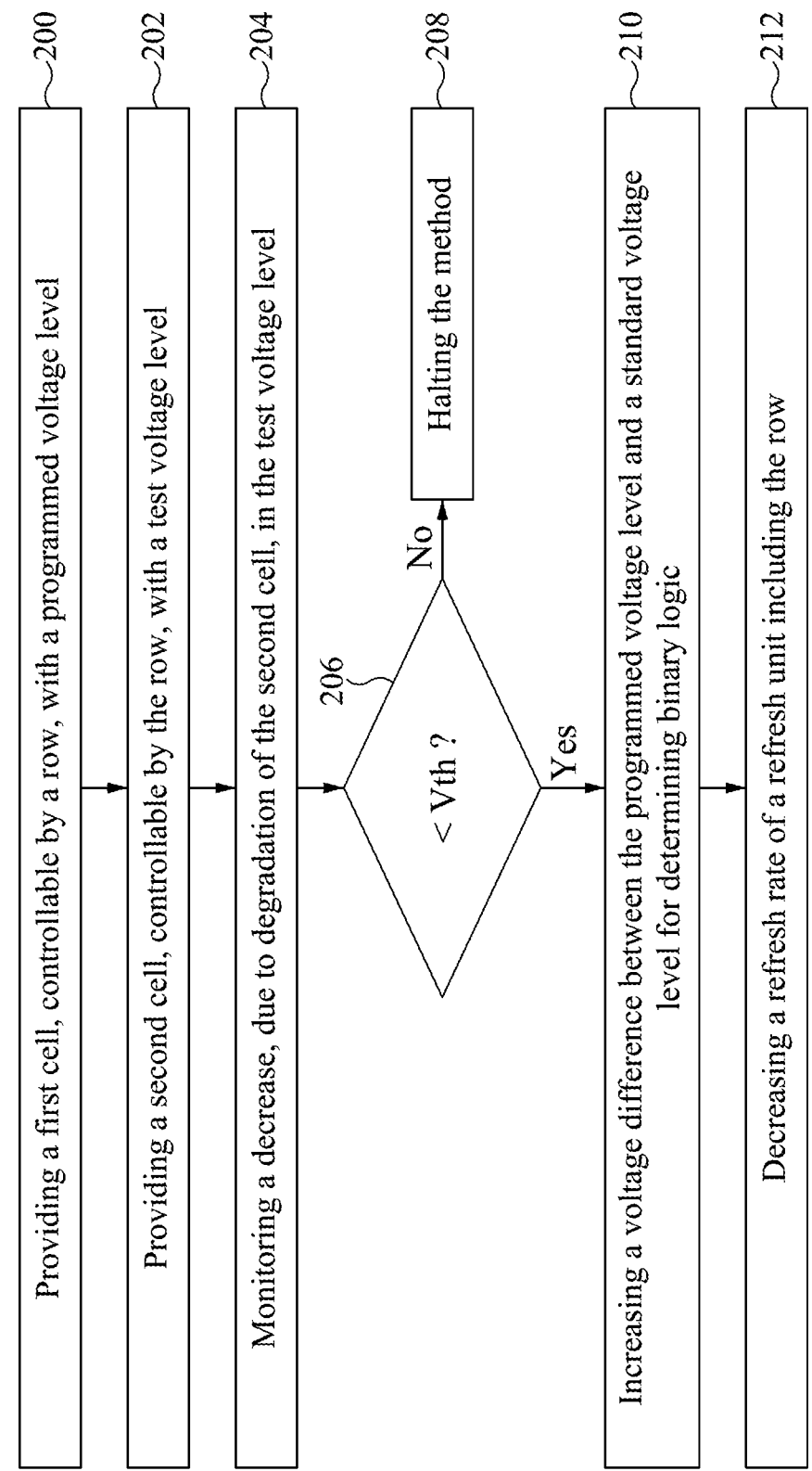
FIG. 2 is a flow diagram of a method of operating a DRAM, in accordance with some embodiments of the present disclosure.

FIG. 2 is a flow diagram of a method 20 of operating a DRAM, in accordance with some embodiments of the present disclosure. Referring to FIG. 2, the method 20 includes operations 200, 202, 204, 206, 208, 210 and 212.

The method 20 begins with operation 200, in which a first cell is provided with a programmed voltage level by being programmed. The first cell is controllable by a row, and is for storing data. The first cell stores a user data, and therefore can be called a user cell.

The method 20 continues with operation 202, in which a second cell is provided with a test voltage level by being programmed in conjunction with the first cell. The second cell is controllable by the same row as the first cell. The second cell is not used to store a user data, and therefore is called a redundant cell.

The method 20 proceeds to operation 204, in which a decrease in the test voltage level due to degradation of the second cell is monitored by, for example, sensing the test voltage level. After the DRAM has been used for a long time, the second cell gradually becomes degraded and therefore the test voltage level is gradually decreased.

The method 20 continues with operation 206, in which it is determined whether the test voltage level becomes lower than a threshold voltage level Vth, wherein the threshold voltage level Vth is higher than a standard voltage level for determining binary logic. The binary logic includes binary 1 and binary 0. If negative, the method 20 proceeds to operation 208, in which the method 20 is halted. If affirmative, the method 20 proceeds to operation 210, in which a voltage difference, associated with a refresh unit including the row, between the programmed voltage level and the standard voltage level for determining binary logic is increased.

Subsequent to operation 210, in operation 212, the refresh rate of the refresh unit including the row is decreased.

In the present disclosure, a refresh unit that includes the degraded first cell for storing a user data can be identified. As such, the voltage difference associated with the first cell can be increased to prevent the user data from being lost. Moreover, since such refresh unit can be identified, a refresh rate of such refresh unit can be decreased after the voltage difference between the programmed voltage level and the standard voltage level is increased. As a result, power consumption of a DRAM operating in the manner of the present disclosure is relatively efficient.

Figure 3:
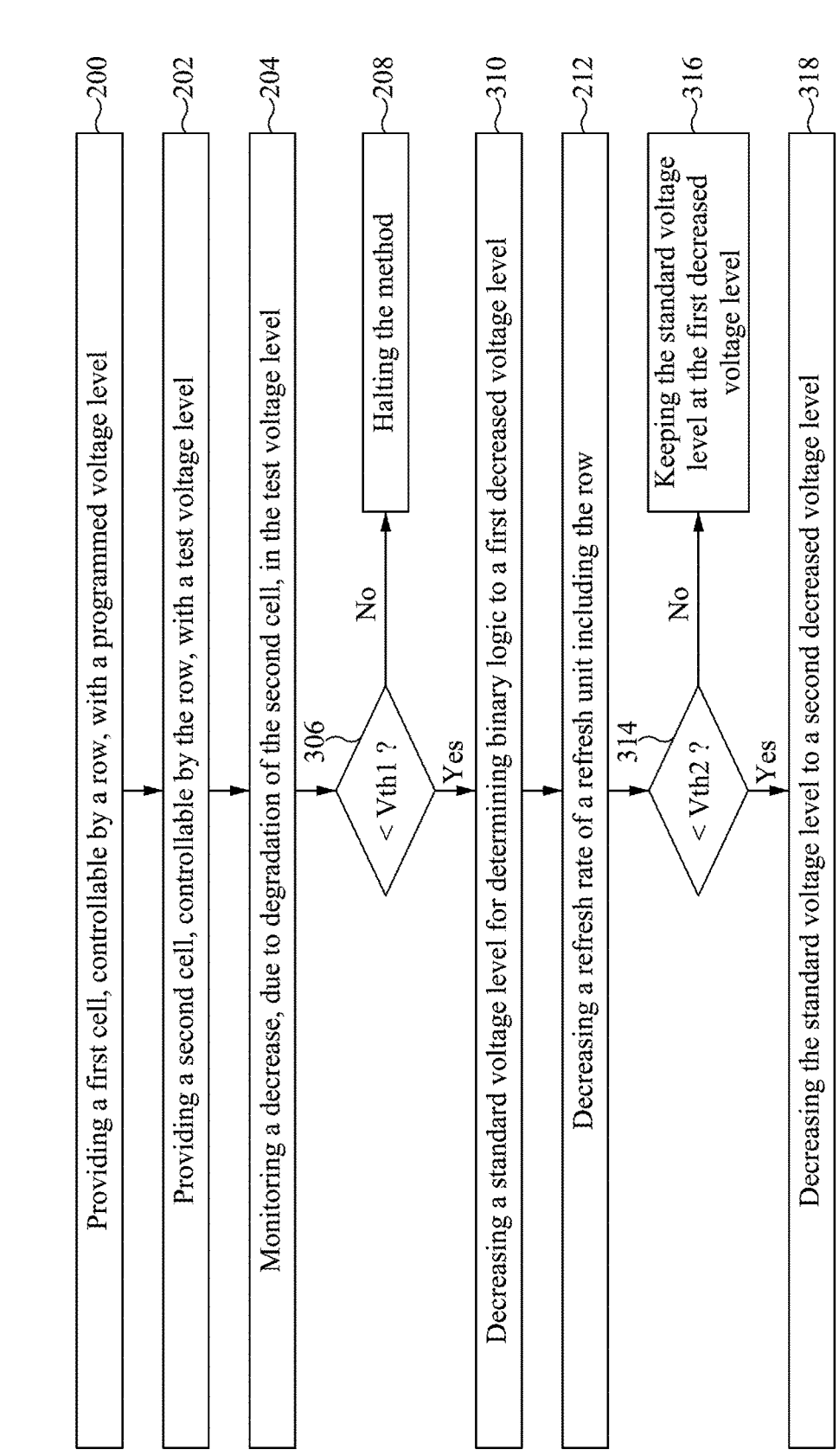
FIG. 3 is a flow diagram of another method of operating a DRAM, in accordance with some embodiments of the present disclosure

FIG. 3 is a flow diagram of a method 30 of operating a DRAM, in accordance with some embodiments of the present disclosure. Referring to FIG. 3, the method 30 is similar to the method 20 described and illustrated with reference to FIG. 2 except that, for example, the method 30 includes operations 306, 310, 314, 316, and 318.

In operation 306, it is determined whether the test voltage level becomes lower than a first threshold voltage level Vth1 higher than a standard voltage level for determining binary logic. If negative, the method 30 proceeds to operation 208. If affirmative, the method 30 proceeds to operation 310, in which a standard voltage level for determining binary logic is decreased to a first decreased voltage level.

In operation 314, it is determined whether the test voltage level becomes lower than a second threshold voltage level Vth2, which is lower than the first threshold voltage level Vth1 and higher than the standard voltage level. If negative, the method 30 proceeds to operation 316, in which the standard voltage level is kept at the first decreased voltage level. If affirmative, the method 30 proceeds to operation 318, in which the standard voltage level is decreased to a second decreased voltage level lower than the first decreased voltage level.

In summary, a level of a decrease of the test voltage level has positive correlation with a level of a decrease of the standard voltage level.

In the present disclosure, a refresh unit that includes the degraded first cell for storing a user data can be identified. As such, the voltage difference associated with the first cell can be increased to prevent the user data from being lost. Moreover, since such refresh unit can be identified, a refresh rate of such refresh unit can be decreased after the voltage difference between the programmed voltage level and the standard voltage level is increased. As a result, power consumption of a DRAM operating in the manner of the present disclosure is relatively efficient. Moreover, since a decrease level of a standard voltage level can be adjusted based on a level of degradation of the second cell, application of a DRAM operating in the manner of the present disclosure is relatively flexible.

Figure 4:
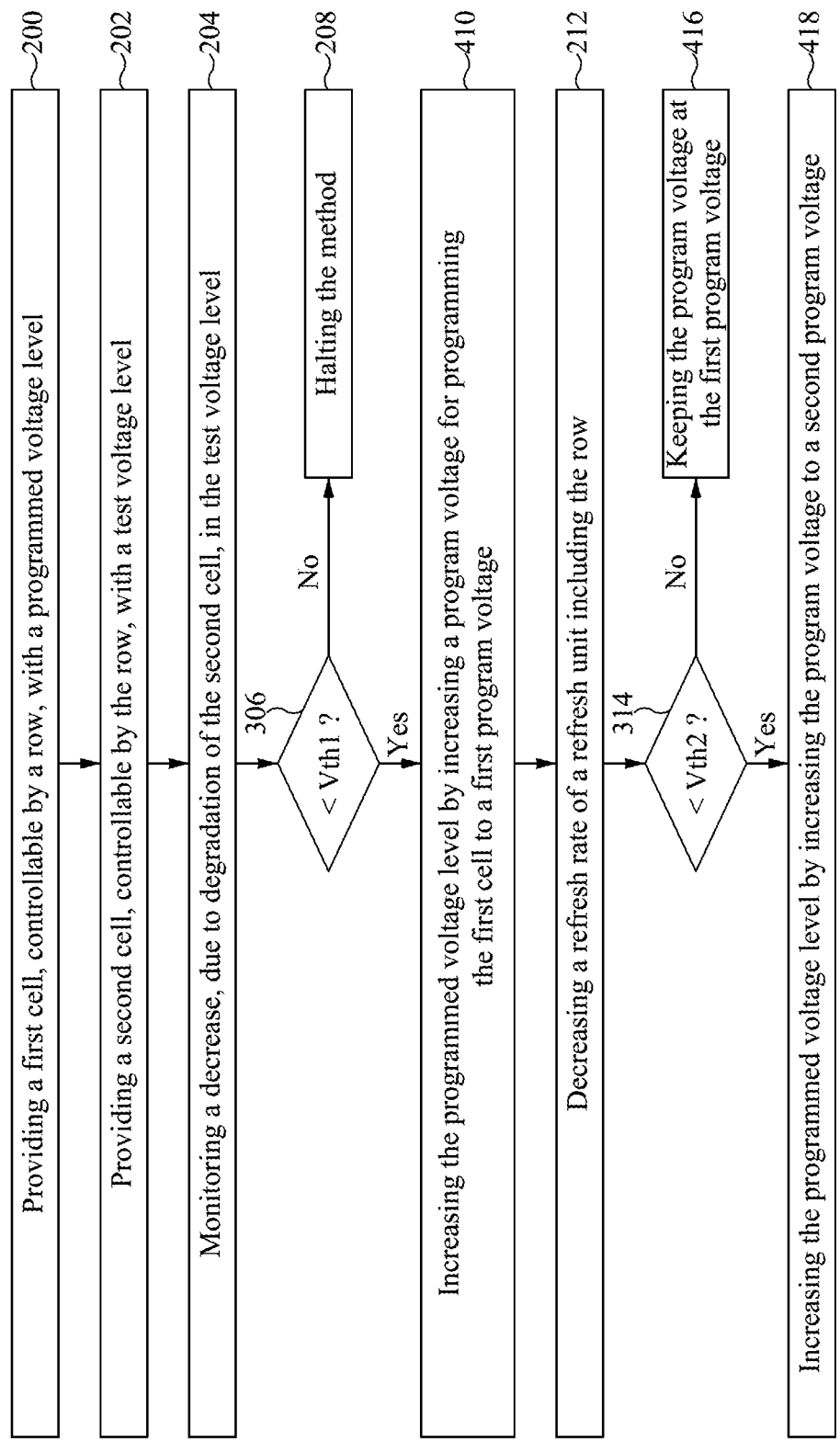
FIG. 4 is a flow diagram of yet another method of operating a DRAM, in accordance with some embodiments of the present disclosure.

FIG. 4 is a flow diagram of a method 40 of operating a DRAM, in accordance with some embodiments of the present disclosure. Referring to FIG. 4, the method 40 is similar to the method 30 described and illustrated with reference to FIG. 3 except that, for example, the method 40 includes operations 410, 416, and 418.

Subsequent to operation 306, in operation 410, a programmed voltage level is increased by increasing a program voltage for programming the first cell and the second cell to a first program voltage. By increasing the program voltage, a capacitor of the degraded first cell is able to be charged to a voltage level to which the first cell is able to be charged, or charged to be higher than the voltage level, thereby keeping the voltage difference associated with the first cell unchanged, or even increasing the voltage difference associated with the first cell. As a result, a possibility of misjudgment on binary logic of the first cell is not increased even though the first cell is degraded.

Subsequent to operation 314, in operation 416, in which the program voltage is kept at the first program voltage. Alternatively, subsequent to operation 314, in operation 418, the programmed voltage level is increased by increasing the program voltage to a second program voltage higher than the first program voltage.

In summary, a level of a decrease of the test voltage level has positive correlation with a level of a decrease of the standard voltage level.

In the present disclosure, a refresh unit that includes the degraded first cell for storing a user data can be identified. As such, the voltage difference associated with the first cell can be increased to prevent the user data from being lost. Moreover, since such refresh unit can be identified, a refresh rate of such refresh unit can be decreased after the voltage difference between the programmed voltage level and the standard voltage level is increased. As a result, power consumption of a DRAM operating in the manner of the present disclosure is relatively efficient. Moreover, since an increase level of a program voltage can be adjusted based on a level of degradation of the second cell, application of a DRAM operating in the manner of the present disclosure is relatively flexible.

Figure 5:
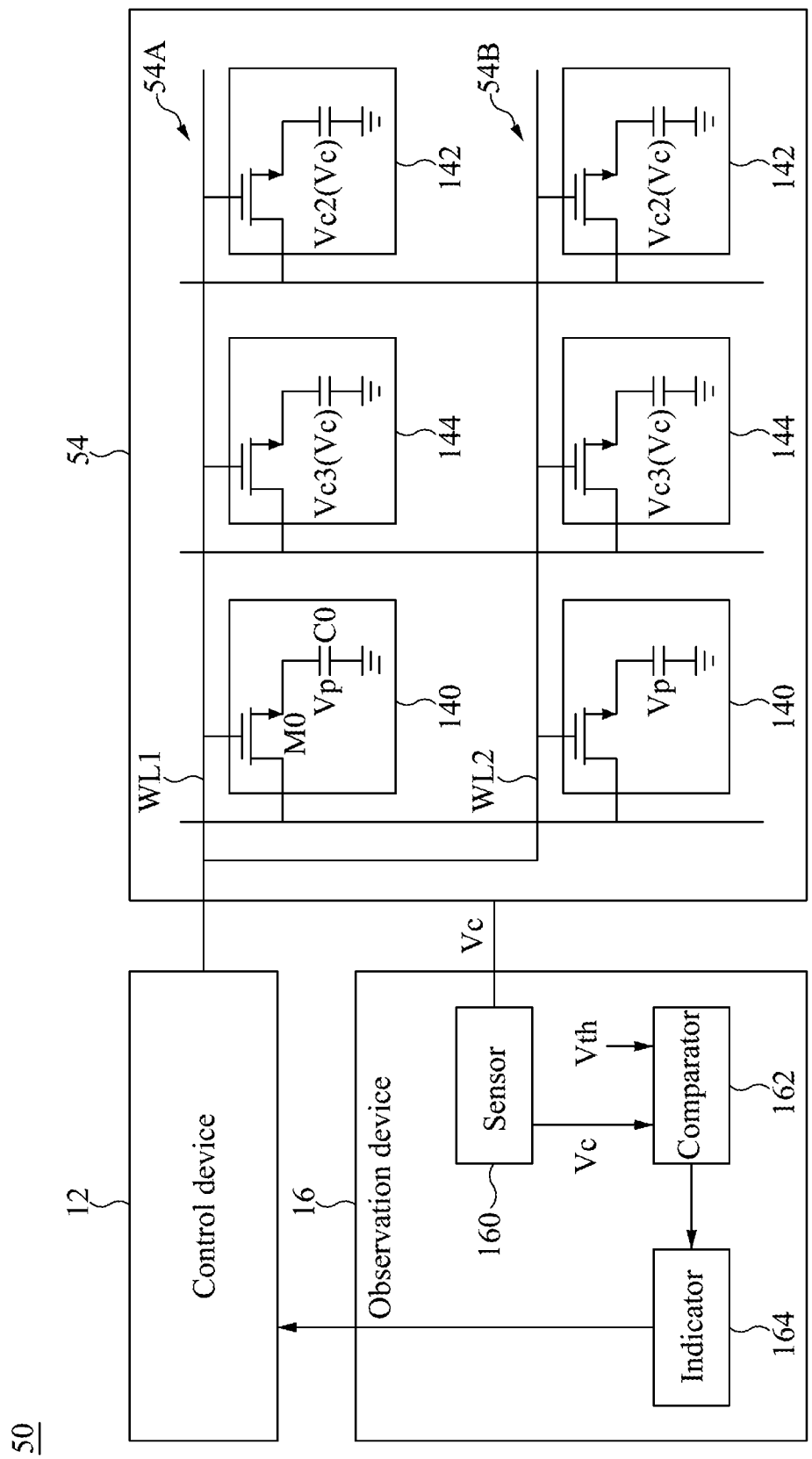
FIG. 5 is a block diagram of another dynamic random access memory (DRAM), in accordance with some embodiments of the present disclosure.

FIG. 5 is a block diagram of another dynamic random access memory (DRAM) 50, in accordance with some embodiments of the present disclosure. Referring to FIG. 5, the DRAM 50 is similar to the DRAM 10 described and illustrated with reference to FIG. 1 except that, for example, the DRAM 50 includes a memory array 54. The memory array 54 includes a first refresh unit 54A and a second refresh unit 54B, which are similar to the first refresh unit 14A and the second refresh unit 14B described and illustrated with reference to FIG. 1 except that each of the first refresh unit 54A and the second refresh unit 54B further includes a third cell 144. The third cell 144 is provided with a test voltage level Vc by being programmed in conjunction with the first cell 140 and the second cell 142. In the present embodiment, the third cell 144 is provided with the same test voltage level Vc as the second cell 142. However, the present disclosure is not limited thereto. In another embodiment, the third cell 144 is provided with a test voltage level that is different from that of the second cell 142. For convenience of discussion, the test voltage level Vc of the second cell 142 is called the second test voltage level Vc2. The test voltage level Vc of the third cell 144 is called the third test voltage level Vc3.

Function and operation of the third cell 144 are similar to those of the second cell 142. Therefore, the detailed descriptions are omitted herein.

The control device 12 decreases the standard voltage level to a first decreased voltage level when the second test voltage level Vc2 becomes lower than the threshold voltage level Vth and when the third test voltage level Vc3 remains higher than the threshold voltage level Vth. Alternatively, the control device 12 decrease the standard voltage level to a second decreased voltage level lower than the first decreased voltage level when both the second test voltage level Vc2 and the third test voltage level Vc3 become lower than the threshold voltage level Vth.

In summary, a quantity of cells, whose test voltage level becomes lower than the threshold voltage level, of the refresh unit has positive correlation with a level of a decrease of the standard voltage level. When the quantity is greater, a level of degradation of the refresh unit is higher; accordingly, when the quantity is greater, the level of the decrease of the standard voltage level is higher.

In the present disclosure, with the observation device 16 and the second cell 142 and the third cell 144, a refresh unit that includes the degraded first cell 140 for storing a user data can be identified. As such, the voltage difference associated with the first cell 140 can be increased to prevent the user data from being lost. Moreover, since such refresh unit can be identified, a refresh rate of such refresh unit can be decreased after the voltage difference between the programmed voltage level Vp and the standard voltage level is increased. As a result, power consumption of the DRAM 10 is relatively efficient. Additionally, since a decrease level of a standard voltage level can be adjusted based on a level of degradation of a refresh unit, application of the DRAM 50 is relatively flexible.

Figure 6:
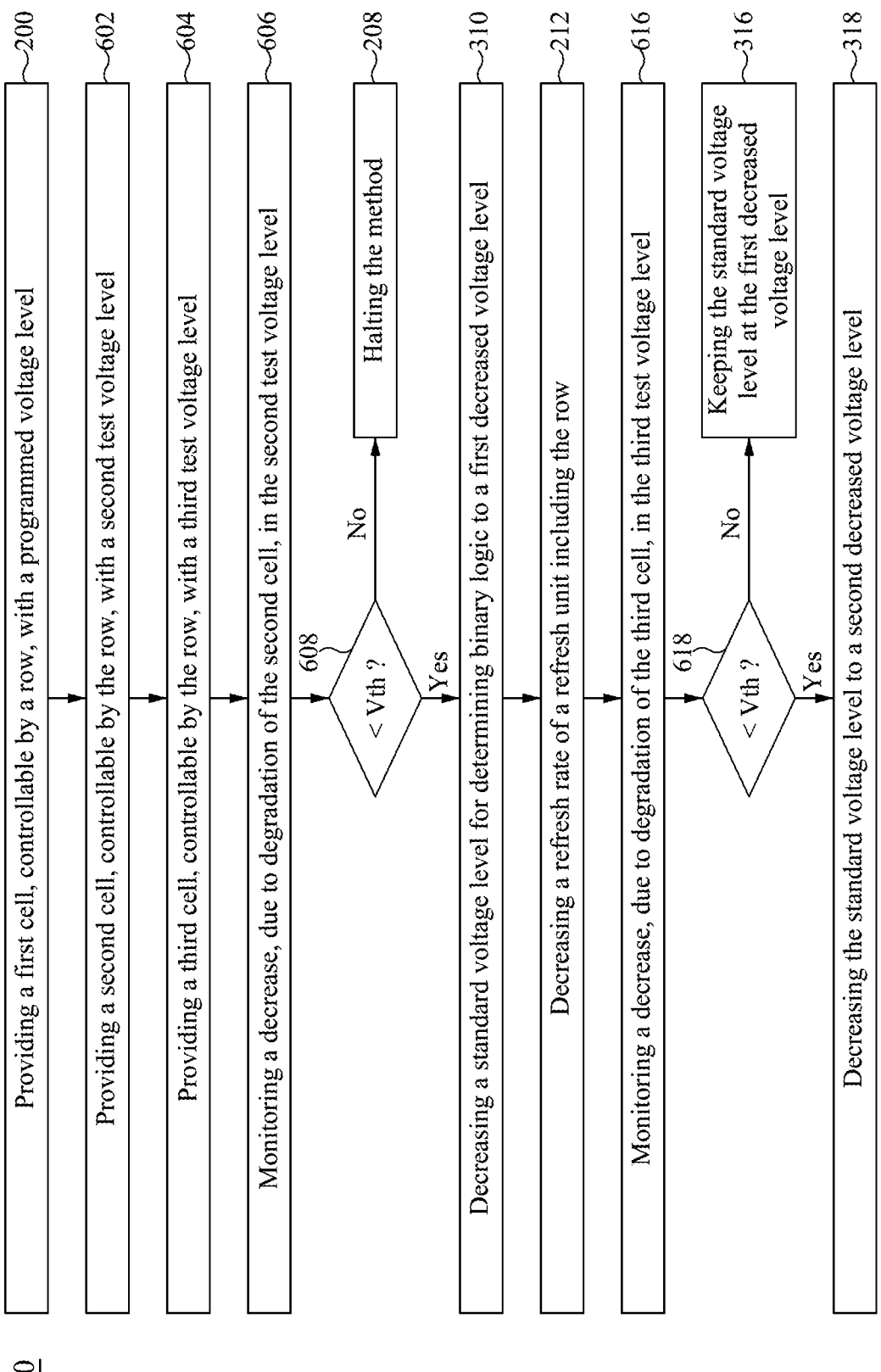
FIG. 6 is a flow diagram of a method of operating a DRAM, in accordance with some embodiments of the present disclosure.

FIG. 6 is a flow diagram of a method 60 of operating a DRAM, in accordance with some embodiments of the present disclosure. Referring to FIG. 6, the method 60 is similar to the method 30 described and illustrated with reference to FIG. 3 except that, for example, the method 60 includes operations 602, 604, 606, 608, 616 and 618.

In operation 602, a second cell, controllable by the row, is provided with a second test voltage level by being programmed in conjunction with the first cell.

In operation 604, a third cell, controllable by the row, is provided with a third test voltage level by being programmed in conjunction with the first cell and the second cell.

In operation 606, a decrease, due to degradation of the second cell, in the second test voltage level is monitored.

In operation 608, it is determined whether the second test voltage level becomes lower than a threshold voltage level Vth higher than a standard voltage level for determining binary logic. If negative, the method 60 proceeds to operation 208. If affirmative, the method 60 proceeds to operation 310.

In operation 616, a decrease, due to degradation of the third cell, in the third test voltage level is monitored.

In operation 618, it is determined whether the third test voltage level becomes lower than the threshold voltage level Vth. If negative, the method 60 proceeds to operation 316. If affirmative, the method 60 proceeds to operation 318.

In summary, a quantity of cells, whose test voltage level becomes lower than the threshold voltage level, of the refresh unit has positive correlation with a level of a decrease of the standard voltage level. When the quantity is greater, a level of degradation of the refresh unit is higher; accordingly, when the quantity is greater, the level of the decrease of the standard voltage level is higher.

In the present disclosure, a refresh unit that includes the degraded first cell for storing a user data can be identified. As such, the voltage difference associated with the first cell can be increased to prevent the user data from being lost. Moreover, since such refresh unit can be identified, a refresh rate of such refresh unit can be decreased after the voltage difference between the programmed voltage level and the standard voltage level is increased. As a result, power consumption of a DRAM operating in the manner of the present disclosure is relatively efficient. Moreover, since a decrease level of a standard voltage level can be adjusted based on a level of degradation of a refresh unit, application of a DRAM operating in the manner of the present disclosure is relatively flexible.

Figure 7:
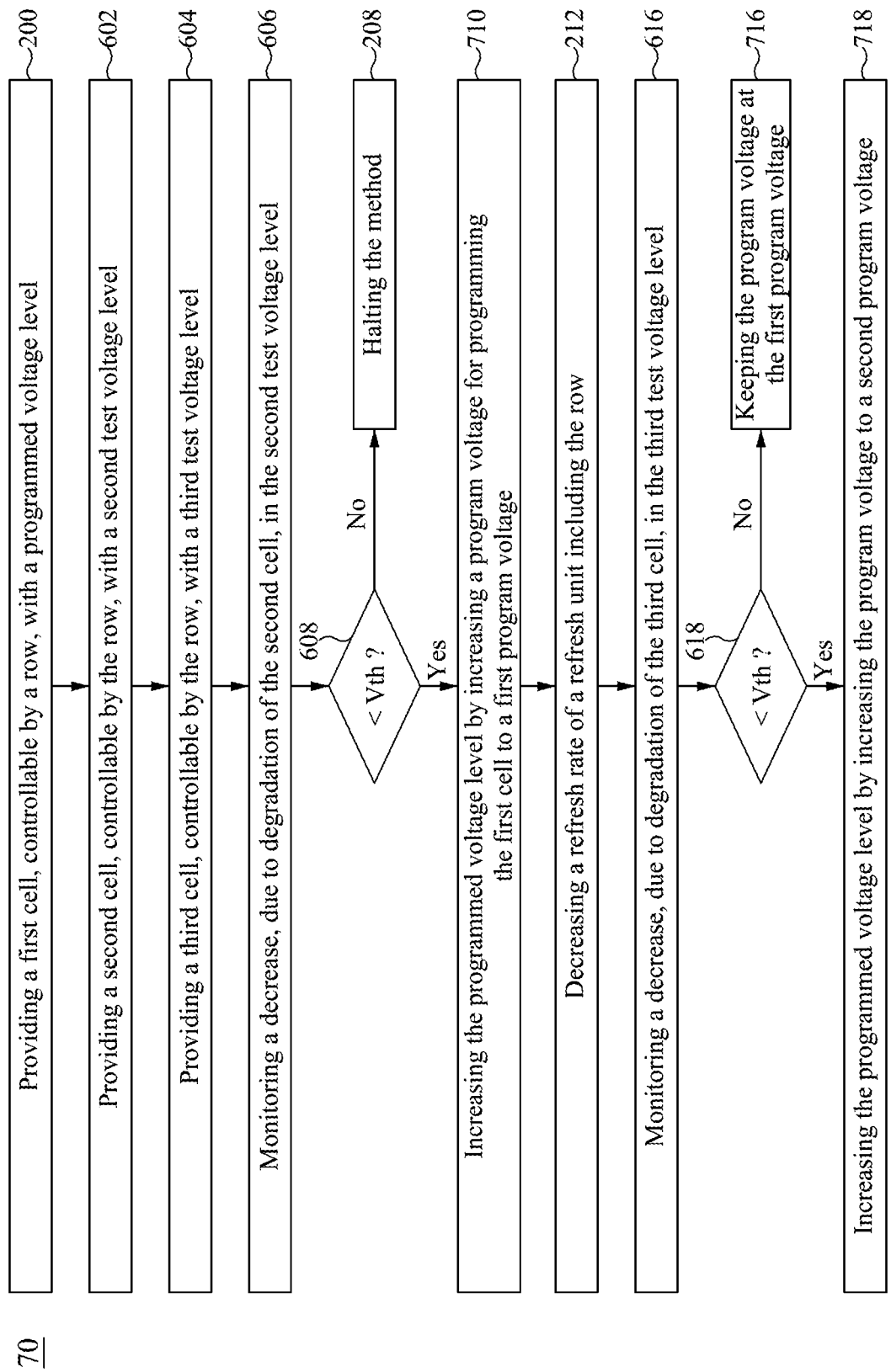
FIG. 7 is a flow diagram of a method of operating a DRAM, in accordance with some embodiments of the present disclosure.

FIG. 7 is a flow diagram of another method 70 of operating a DRAM, in accordance with some embodiments of the present disclosure. Referring to FIG. 7, the method 70 is similar to the method 60 described and illustrated with reference to FIG. 6 except that, for example, the method 70 includes operations 710, 716 and 718.

Subsequent to operation 608, in operation 710, the programmed voltage level is increased by increasing a program voltage for programming the first cell to a first program voltage. As such, a capacitor of the degraded first cell is able to be charged to a voltage level to which the not degraded first cell is able to be charged, thereby keeping the voltage difference associated with the first cell unchanged, or even increasing the voltage difference associated with the first cell. As a result, a possibility of misjudgment on binary logic of the first cell is not increased even though the first cell is degraded.

Subsequent to operation 618, in operation 716, in which the program voltage is kept at the first program voltage. Alternatively, subsequent to operation 618, in operation 718, the programmed voltage level is increased by increasing the program voltage to a second program voltage higher than the first program voltage. As such, a capacitor of the degraded first cell is able to be charged to a voltage level higher than a voltage level to which the not degraded first cell is able to be charged in a given period, thereby increasing the voltage difference associated with the first cell. As a result, a possibility of misjudgment on binary logic of the first cell is not increased even though the first cell is degraded.

In summary, a quantity of cells, whose test voltage level becomes lower than the threshold voltage level, of the refresh unit has positive correlation with a level of an increase of a program voltage for programming the first cell and the second cell. When the quantity is greater, a level of degradation of the refresh unit is higher; accordingly, when the quantity is greater, the level of the increase of the program voltage is higher.

In the present disclosure, a refresh unit that includes the degraded first cell for storing a user data can be identified. As such, the voltage difference associated with the first cell can be increased to prevent the user data from being lost. Moreover, since such refresh unit can be identified, a refresh rate of such refresh unit can be decreased after the voltage difference between the programmed voltage level and the standard voltage level is increased. As a result, power consumption of a DRAM operating in the manner of the present disclosure is relatively efficient. Moreover, since an increase level of a program voltage can be adjusted based on a level of degradation of the second cell, application of a DRAM operating in the manner of the present disclosure is relatively flexible.

One aspect of the present disclosure provides a DRAM including a memory array and a control device. The memory array includes a refresh unit. The refresh unit includes a first cell and a second cell. The first cell is configured to store data, and have a programmed voltage level by being programmed. The second cell is configured to have a test voltage level by being programmed in conjunction with the first cell, wherein the first cell and the second cell are controllable by a same row of the memory array. The control device is configured to increase a voltage difference between the programmed voltage level and a standard voltage level for determining binary logic when the test voltage level becomes lower than a threshold voltage level, wherein the threshold voltage level is higher than the standard voltage level.

Another aspect of the present disclosure provides a method. The method includes programming a first cell and a second cell controllable by a row of a refresh unit, wherein the first cell has a programmed voltage level and the second cell has a test voltage level by being programmed; sensing the test voltage level of the second cell; and increasing a voltage difference between the programmed voltage level and a standard voltage level for determining binary logic when the test voltage level becomes lower than a threshold voltage level, wherein the threshold voltage level is higher than the standard voltage level.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic random access memory (DRAM), comprising:
   a memory array including:
      a refresh unit including:
         a first cell configured to store data, and have a programmed voltage level by being programmed; and
         a second cell configured to have a test voltage level by being programmed in conjunction with the first cell, wherein the first cell and the second cell are controllable by a same row of the memory array; and
      a control device configured to increase a voltage difference between the programmed voltage level and a standard voltage level for determining binary logic when the test voltage level becomes lower than a threshold voltage level, wherein the threshold voltage level is higher than the standard voltage level;
   wherein the threshold voltage level is a first threshold voltage level, the control device is configured to increase the programmed voltage level by increasing a program voltage for programming the first cell and the second cell to a first program voltage when the test voltage level becomes lower than the first threshold voltage level and remains higher than a second threshold voltage level, wherein the second threshold voltage level is higher than the standard voltage level.

2. The DRAM of claim 1, wherein the control device is configured to increase the program voltage to a second program voltage higher than the first program voltage when the test voltage level becomes lower than both the first threshold voltage level and the second threshold voltage level.

3. The DRAM of claim 1, wherein the test voltage level is a second test voltage level, the refresh unit further including a third cell configured to have a third test voltage level by being programmed in conjunction with the first cell,
   wherein the control device is configured to increase the program voltage to a first program voltage when the second test voltage level becomes lower than the threshold voltage level and the third test voltage level remains higher than the threshold voltage level.

4. The DRAM of claim 3, wherein the control device is configured to increase the program voltage to a second program voltage higher than the first program voltage when both the second test voltage level and the third test voltage level become lower than the threshold voltage level.

5. A method, comprising:
   programming a first cell and a second cell controllable by a row of a refresh unit, wherein the first cell has a programmed voltage level and the second cell has a test voltage level by being programmed;
   sensing the test voltage level of the second cell; and
   increasing a voltage difference between the programmed voltage level and a standard voltage level for determining binary logic by increasing a program voltage for programming the first cell and the second cell to a first program voltage when the test voltage level becomes lower than a threshold voltage level, wherein the threshold voltage level is higher than the standard voltage level, and the threshold voltage level is a first threshold voltage level and remains higher than a second threshold voltage level higher than the standard voltage level.

* * * * *